(12) United States Patent
Chou

(10) Patent No.: US 6,396,731 B1
(45) Date of Patent: May 28, 2002

(54) SRAM CELL EMPLOYING TUNNEL SWITCHED DIODE

(75) Inventor: Yung-Fa Chou, Kaohsiung (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/822,663

(22) Filed: Mar. 30, 2001

(51) Int. Cl.[7] ............................................... G11C 11/00
(52) U.S. Cl. ....................................... 365/154; 365/175
(58) Field of Search ................................. 365/154, 174, 365/175

(56) References Cited

U.S. PATENT DOCUMENTS 4,091,461 A * 5/1978 Booher ........................ 365/154
6,104,631 A * 8/2000 El-Sharawy et al. ........ 365/154

* cited by examiner

Primary Examiner—Tan T. Nguyen
(74) Attorney, Agent, or Firm—Randy W. Tung

(57) ABSTRACT

A static random access memory (SRAM) cell is formed by a tunnel switched diode (TSD) and a pair of transistors. The TSD has a characteristic I-V curve exhibiting a negative differential resistance region that allows the TSD to function as a bi-stable storage device. NMOS and PMOS transistors coupled between the TSD and word and bit lines function to access the TSD for purposes of address, read and write functions of the cell. The cells can be connected in high density, high performance arrays. The TSD's are formed from layered materials that result in small cell size while allowing for high level of cell current.

19 Claims, 3 Drawing Sheets

| Mode | Word-line | Bit-line | Voltage Difference Accross TSD |
|---|---|---|---|
| Standby | 0.0V | 0.0V | $V_{DD} - V_{th,p} = 2.5 - 1.2 = 1.3V = V_{sb}$ |
| Read | 2.5.V | 0.7V | $V_{DD} - V_{b1} = 2.5 - 0.7 = 1.8V = V_{rd}$ |
| Write '1' | 2.5.V | 0.0V | $V_{DD} - V_{b1} = 2.5 - 0.0 = 2.5V > V_{max}$ |
| Write '0' | 2.5.V | 2.5V | $V_{DD} - V_{b1} + V_{th,n} = 2.5 - 2.5 + 0.5 = 0.5 < V_{min}$ |

SRAM CELL EMPLOYING TUNNEL SWITCHED DIODE

TECHNICAL FIELD

The present invention broadly relates to static random access memory (SRAM) cells and deals more particularly with an SRAM cell employing a tunnel switched diode (TSD) that acts as the storage medium and is controlled by a pair of switching transistors.

BACKGROUND OF THE INVENTION

Dynamic random access memories (DRAM) and static random access memories (SRAM) are being used with increasing frequency in a wide variety of applications requiring temporary data storage. The trend toward higher density and higher performance memories has resulted in a number of improvements in DRAM and SRAM architecture. For example, BJT (bipolar junction transistors) based single transistor, and diode-based single transistor SRAM cells are representative of two new memory devices. However, each of these devices has certain disadvantages. For example, BJT based SRAMs suffer from reliability problems, while diode based SRAMs are not suitable for being manufactured in CMOS processes. Conventional SRAM cells generally operate at relatively high cell current levels, but take up a relatively large area because of the need for using as many as 10 transistors per cell. Conventional DRAM cells possess a relatively small footprint since they may be formed of a single transistor and a single capacitor, however these memory devices, which rely on capacitor discharge current, are not capable of handling large cell current.

What is needed is an improved SRAM cell that is relatively small in physical area, thus allowing high memory array cell density, while also providing for relatively large cell currents that are required in high performance applications. It has been suggested that the solution may lie in the use of tunnel switched diodes (TSD), however SRAM cells utilizing TSDs have not been previously constructed into memory cell arrays as a result of their need for relatively large standby current. The present invention solves this problem by providing an SRAM cell utilizing a TSD as the storage medium, and a pair of transistors as the control devices.

SUMMARY OF THE INVENTION

According to one aspect of the invention, an SRAM cell comprises a word line, a bit line, a TSD, and a pair of electronic gate devices for controlling access to the TSD. The electronic gate devices are preferably in the form of an NMOS transistor and a PMOS transistor.

According to another aspect of the invention, an SRAM cell comprises a word line, a bit line, a bi-stable device for storing a data bit in the cell and control circuit means for controlling the state of the bi-stable device. The bi-stable device is preferably a TSD possessing a characteristic I-V curve having a region of high impedance, a region of negative differential resistance and a region of low impedance. NMOS and PMOS transistors coupled between the TSD and the word and bit lines function to access the TSD for purposes of address, read and write functions of the cell. The cells can be connected in high density, high performance arrays. The TSD's are formed from layered materials that result in small cell size while allowing for high levels of cell current.

Accordingly, it is a primary object of the invention to provide an SRAM cell allowing relatively high levels of cell current and physically displacing a relatively small area.

Another object of the invention is to provide an SRAM cell of the type mentioned above which is well suited to be manufactured in high density arrays using conventional CMOS processing techniques.

A further object of the invention is to provide an SRAM cell as mentioned above which utilizes a minimum number of active components.

A further object of the invention is to provide an SRAM cell of the type described above which utilizes a TSD without the need for a large standby current.

These, and further objects and advantages of the invention will be made clear or will become apparent during the course of the foregoing description of a preferred embodiment of the invention.

BRIEF DESCRIPTION OF THE DRAWINGS

In the drawings, which form an integral part of the specification, and are to be read in conjunction therewith, and in which like reference numerals are employed to designate identical components in the various views.

DETAILED DESCRIPTION OF THE PREFERRED EMBODIMENTS

Figure 1:
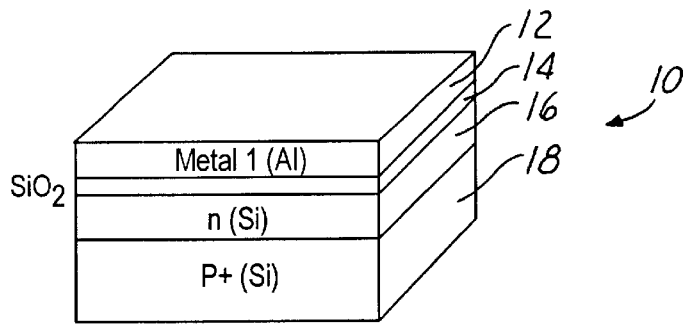
FIG. 1 is a diagrammatic, perspective view of a TSD device used in the SRAM cell forming the preferred embodiment of the invention.
Figure 2:
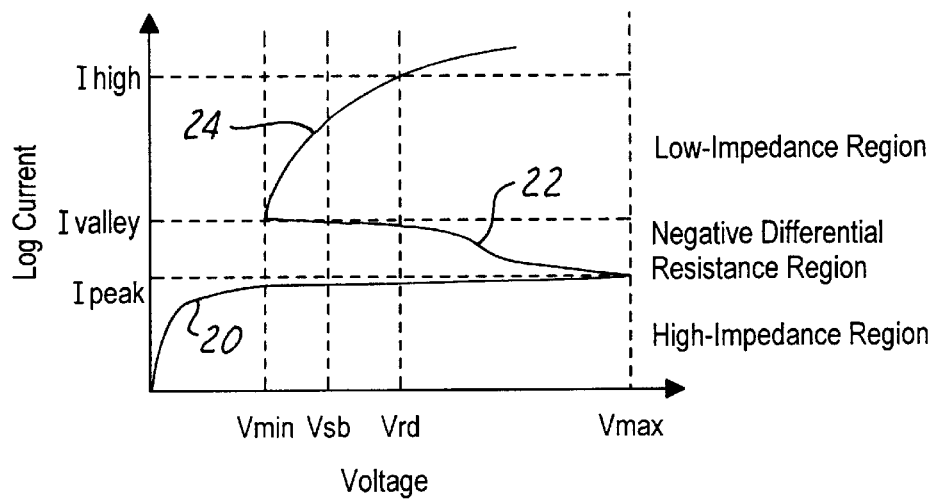
FIG. 2 is a graph showing the characteristic curve of the TSD of FIG. 1.

Referring first to FIGS. 1 and 2, the present invention involves a memory cell that takes advantage of the characteristics of a so-called tunnel switched diode (TSD). A TSD indicated by the numeral 10 is a multi-layered device that exhibits memory as a result of the fact that it permits two stable current amperages at a given voltage, depending upon how it is switched. This characteristic is sometimes referred to as the negative differential resistance phenomenon. The TSD 10 comprises a PN junction formed by a layer of P+ silicon (Si) 18 and an abutting layer of n-type Si 16. Formed on top of the n-type layer 16 is a layer 14 of $SiO_2$. A layer 12 of a suitable metal, such as aluminum is then deposited over the layer 14 of $SiO_2$. The layered structures shown in FIG. 1 can be manufactured using conventional semiconductor processing techniques. The current-voltage (I-V) characteristic curve of the TSD 10 shown in FIG. 1, is depicted in FIG. 2. The curve possesses a first portion 20 up to a first current level ($I_{peak}$) in which the device exhibits high impedance. Then, at a certain maximum voltage ($V_{max}$), the device begins to exhibit so-called negative differential resistance, up to a second, higher current level ($I_{valley}$), as shown by the curve portion 22. At still higher current levels ($I_{high}$), the device operates in the low impedance region shown by the curve portion 24. From the foregoing, it may be appreciated that the device 10 is capable of operating at different levels of current at the same level of applied voltage, and thus exhibits bi-stable states, allowing the device 10 to store a logic "1" or logic "0".

Figure 3:
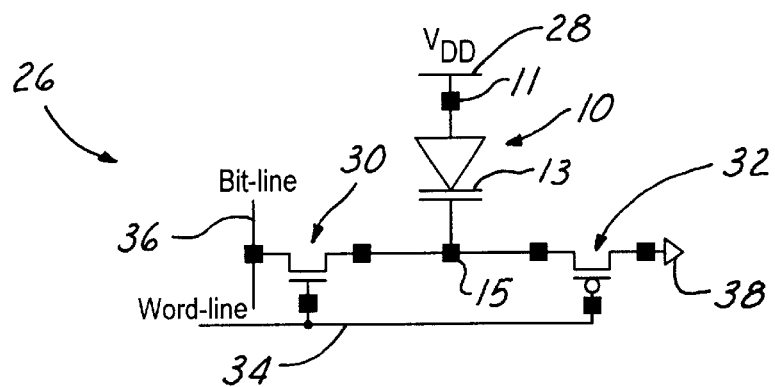
FIG. 3 is a detailed schematic diagram of a single SRAM cell employing the TSD of FIG. 1.
Figures 4, 6:
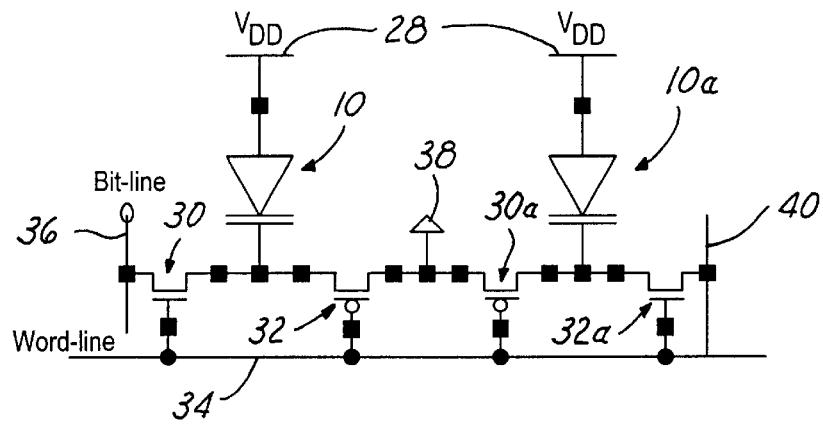
FIG. 4 is a detailed schematic diagram showing a pair of SRAM cells in accordance with the present invention.

Referring now also to FIG. 3, an SRAM cell generally indicated by the numeral 26 broadly comprises a TSD 10 and a pair of electronic gating devices in the form of an NMOS transistor 30 and PMOS transistors 32. The control gates of transistors 30, 32 are connected to a word line 34 to which the cell 26 is connected. The TSD 10 includes an anode terminal 11 connected with a voltage source $V_{DD}$ 28, and a cathode 13 coupled by terminal 15 between the source to drain path of the transistors 30, 32. The source-to-drain path of transistor 30 is coupled between terminal 15 and a bit line 36, while the source-to-drain path of transistor 32 is connected between terminal 15 and ground 38. Transistors 30,32 function to access the TSD 10 and control read and write functions of the cell 26. The various functional modes of the cell 26 are shown in FIG. 6, along with the corresponding states of voltage of the word line 34, bit line 36 and the voltage differential across the TSD. The PMOS transistor 32 provides a DC path for the TSD 10 when the cell 26 is in its standby mode, i.e. the word line 34 and bit line 36 are both at 0 voltage. This state is represented by the voltage $V_{sb}$ in FIG. 2. The NMOS transistor 30 functions as the access transistor to access the storage node (terminal 15) of the TSD 10. When the cell 26 is in the standby mode, transistor 30 is off and transistor 32 is on, thereby connecting the diode 10 to ground 38. The voltage across the TSD 10 would therefore consist of $V_{DD}$ less the voltage $V_{thp}$, or 2.5V–1.2V =1.3V.

When the cell 26 is to be read, the word line 34 goes high, e.g. to 2.5 V. As a result, the NMOS transistor is turned on and the PMOS transistor is turned off. In the read state, the bit line 36 is at 0.7V and the voltage across the TSD 10 consists of $V_{DD}$ minus $V_{bl}$, or 2.5V–0.7V =1.8V. in order to write a 1 into the cell 26, word line 34 remains high and bit line 36 is low. In this condition, the voltage across the TSD 10 is $V_{max}$. In order to write a 0 into the cell 26, both word line 34 and bit line 36 are high (2.5V) and the voltage across the TSD 10 is $V_{min}$.

Figure 5:
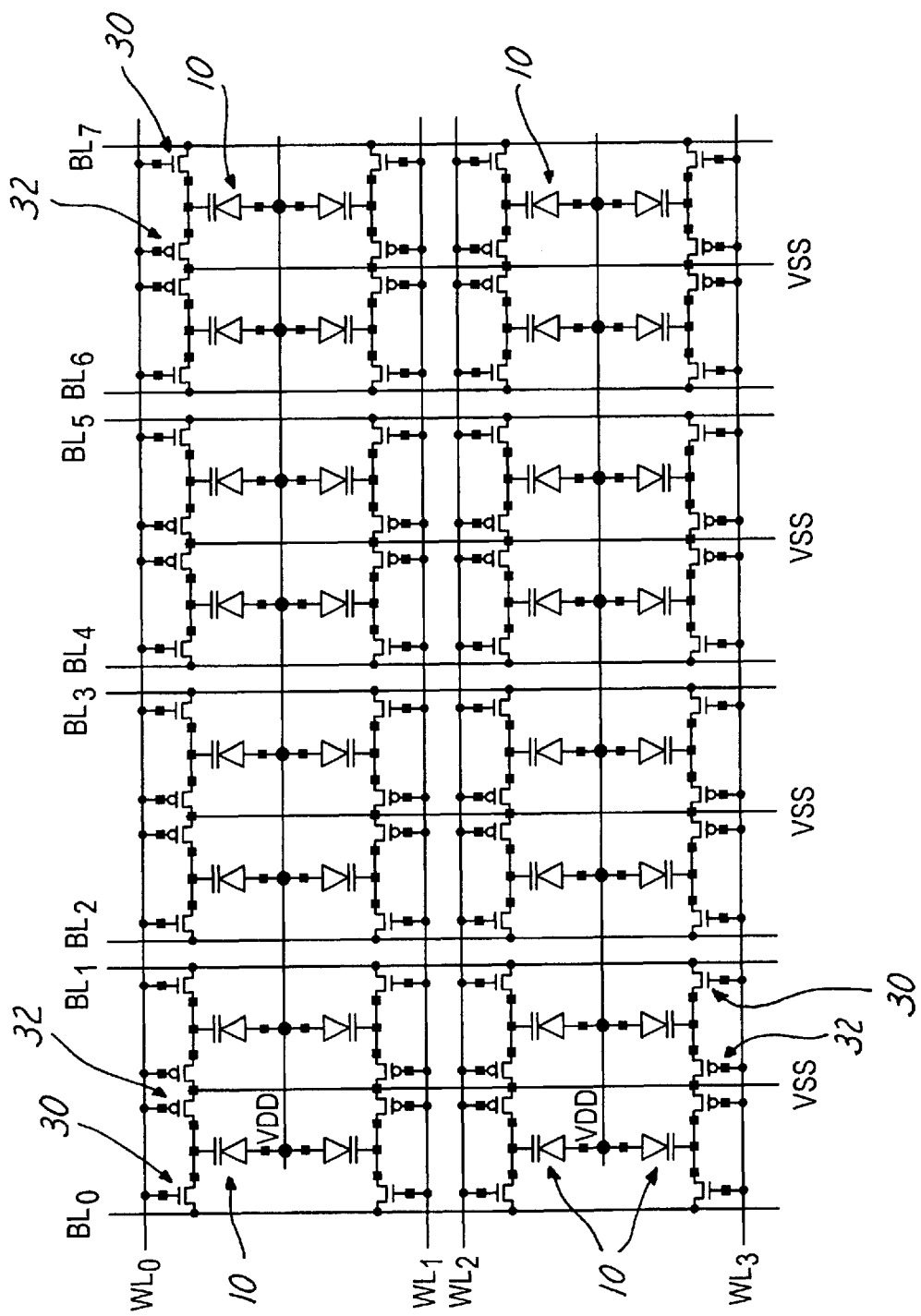
FIG. 5 is a detailed schematic diagram of a high density array of SRAM cells according to the present invention; and, FIG. 6 a table showing voltages of the word line, bit line and voltage across the TSD as a function of the cell's functional model.

From the foregoing, then, it may be readily appreciated that the TSD 10 acts as a bi-stable storage device for storing a bit of data in the cell 26 and that the transistors 30, 32 act as a control circuit for controlling the state of the bi-stable TSD 10. FIG. 4 shows how a pair of the cells may be combined with a pair of bit lines 36, 40 and a common word line 34. The second cell includes a TSD 10a and a pair of PMOS and NMOS transistors 30a, 32a respectively which are coupled between the bit line 40 and a ground 38 that is shared with transistors 30,32. FIG. 5 depicts an array of the cells 26 coupled with a series of word lines $WL_0$–$WL_3$, and an associated set of bit lines $BL_0$–$BL_7$. It may be seen that the TSD 10 share a common source of voltage $V_{DD}$, and common ground, which, in FIG. 5, is designated by VSS.

From the foregoing, it may be appreciated that the novel SRAM cell described above not only provides for the reliable accomplishment of the objects of the invention, but it does so in a particularly economical and efficient manner. It is recognized, of course, that those skilled in the art may make various modifications or additions chosen to illustrate the preferred embodiment without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. A static random access memory (SRAM) cell, comprising:
    a word line;
    a bit line;
    a tunnel switched diode (TSD) having an anode connected to a source of voltage, and a cathode including a cathode terminal;
    a first electronic gate device connected between said bit line and said cathode terminal, said first gate device having a control terminal connected with said word line; and
    a second electronic gate device connected between said bit line and ground, said second gate device having a control terminal connected with said word line.

2. The SRAM cell of claim 1, wherein said first electronic gate includes a NMOS transistor having a source-to-drain path connected between said cathode terminal and said bit line.

3. The SRAM cell of claim 2, wherein said second electronic gate includes a PMOS transistor having a source-to-drain path connected between said cathode terminal and ground.

4. The SRAM cell of claim 1, wherein said second electronic gate includes a PMOS transistor having a source-to-drain path connected between said cathode terminal and ground.

5. The SRAM cell of claim 1, wherein said TSD possesses a characteristic I-V curve exhibiting a region of negative differential resistance.

6. The SRAM cell of claim 1, wherein said TSD includes:
    a first layer of P+ type Si material,
    a second layer of n type Si material over said first layer,
    a third layer of SiO2 over said second layer, and
    a fourth layer of metal covering said third layer.

7. The SRAM cell of claim 1, wherein said metal is Al.

8. An SRAM memory array, comprising:
    a word line;
    N bit lines;
    a voltage source; and
    N SRAM cells respectively associated with said N bit lines, each of said cells including :
        (a) a tunnel switched diode (TSD) coupled with said voltage source for storing a bit of data in the cell,
        (b) a pair of electronic control devices for accessing said TSD, said control devices being connected between an associated bit and said word line.

9. The SRAM memory array of claim 8, wherein:
    said TSD includes an anode connected with said voltage source, and a cathode,
    each of said control devices includes a control terminal coupled with said word line, and
    one of said control devices includes a current path controlled by the associated control terminal and connected between said TSD cathode and said bit line, and the other of said control devices includes a current path controlled by the associated control terminal and connected between said TSD cathode and ground.

10. The SRAM memory array of claim 9, wherein said one control device is defined by an NMOS transistor, and said other control device is defined by a PMOS transistor.

11. The SRAM memory array of claim 10, wherein the current path of each of said control devices is defined by the source-to-drain of the corresponding transistor.

12. The SRAM memory array of claim 8, wherein said TSD includes:
   a first layer of P+ type Si material,
   a second layer of n type Si material over said first layer,
   a third layer of SiO2 over said second layer, and
   a fourth layer of metal covering said third layer.

13. The SRAM cell of claim 12, wherein said metal is Al.

14. A static random access memory (SRAM) cell, comprising:
   a word line;
   a bit line;
   a bi-stable device for storing a bit of data in said cell, said bi-stable device possessing a characteristic I-V curve exhibiting a region of high impedance, a region of negative differential resistance and a region of low impedance; and
   control circuit means for controlling the state of said bi-stable device, said control circuit means being connected with said word line and said bit line.

15. The SRAM cell of claim 14, wherein said bi-stable device includes a tunnel switched diode (TSD) having an anode connected to a source of voltage, and a cathode including a cathode terminal connected to said control circuit means.

16. The SRAM cell of claim 14, wherein said control circuit includes:
   a first transistor having its control gate coupled with said word line, and having its source-to-drain path coupled between said bit line and said bi-stable device,
   a second transistor having its control gate coupled with said word line and having its source-to-drain path coupled between said bi-stable device and ground.

17. The SRAM cell of claim 16, wherein said first transistor is an NMOS transistor, and said second transistor is a PMOS transistor.

18. The SRAM cell of claim 16, wherein said bi-stable device includes a tunnel switched diode (TSD) having an anode connected to a source of voltage, and a cathode including a cathode terminal, said cathode terminal being connected between said first and second transistors.

19. The SRAM cell of claim 14, wherein said bi-stable device includes:
   a first layer of P+ type Si material,
   a second layer of n type Si material over said first layer,
   a third layer of SiO2 over said second layer, and
   a fourth layer of metal covering said third layer.

* * * * *